United States Patent [19]

Ennulat et al.

[11] Patent Number: 4,754,139
[45] Date of Patent: Jun. 28, 1988

[54] UNCOOLED HIGH RESOLUTION INFRARED IMAGING PLANE

[75] Inventors: Reinhard D. Ennulat, Huntington Beach; Dieter Pommerrenig, Laguna Niguel, both of Calif.

[73] Assignee: Aerojet-General Corporation, La Jolla, Calif.

[21] Appl. No.: 850,142

[22] Filed: Apr. 10, 1986

[51] Int. Cl.⁴ .......................... H01L 25/00; G01J 5/08
[52] U.S. Cl. ...................................... 250/332; 250/353
[58] Field of Search ................ 250/330, 332, 338 FE, 250/338 PT, 338 SR, 353, 370 G, 370 J; 356/152; 358/166; 357/32

[56] References Cited

U.S. PATENT DOCUMENTS

| | | | |
|---|---|---|---|
| 3,723,642 | 3/1973 | Laakmann | 178/6 |
| 3,746,454 | 7/1973 | Pace et al. | 356/152 |
| 3,845,296 | 10/1974 | Schnitzler | 250/213 VT |
| 3,846,820 | 11/1974 | Lampe et al. | 357/31 |
| 4,079,507 | 3/1978 | King | 29/578 |
| 4,162,402 | 7/1979 | Hopper | 250/332 |
| 4,379,232 | 4/1983 | Hopper | 250/332 |
| 4,425,502 | 1/1984 | Hall et al. | 250/338 |
| 4,532,424 | 7/1985 | Cheung | 250/338 |
| 4,558,342 | 12/1985 | Sclar | 357/30 |
| 4,575,631 | 3/1986 | Satchell | 250/332 |

Primary Examiner—Janice A. Howell
Assistant Examiner—Constantine Hannaher
Attorney, Agent, or Firm—Leonard Tachner

[57] ABSTRACT

A two-dimensional infrared focal plane employing a uniquely configured detector array for reducing the thermal conductance between detectors and between each detector and its environment to enhance signal-to-noise and spacial resolution without requiring cumbersome cooling. An array of radiation concentrators placed between the detector array and the image and spaced from the array, permits widely spaced detectors without incurring any substantial dead space on the detector plane. Detector support configurations provide for connection to nodes of a readout IC substrate while positioning each detector over an air-filled or evacuated chamber to further reduce thermal conductivity.

19 Claims, 7 Drawing Sheets

UNCOOLED HIGH RESOLUTION INFRARED IMAGING PLANE

BACKGROUND OF THE INVENTION

1. Field of the Invention

The present invention relates generally to the field of electro-optical detecting apparatus which utilizes two-dimensional detector arrays to provide surveillance of an extensive scene and more particularly, to a two-dimensional infrared focal imaging plane having high resolution and high efficiency without requiring the use of cooling devices.

2. Prior Art

In thermal imaging systems infrared radiation emitted by objects as well as the infrared emitted from the background of a scene is focused by infrared optics on a focal imaging plane wherein infrared detectors convert such radiation into electrical signals. Such electrical signals can be converted for display on a cathode ray tube to provide a visible image of the infrared image. Because infrared imaging does not depend on illumination of a scene, thermal imaging systems are particularly conductive for many day and night applications.

The most recent prior art is characterized by thermal imaging systems which utilize mechanical scanning optics to produce an infrared image in a focal plane comprising an array of cooled infrared photon detectors. By way of example, this concept is illustrated in U.S. Pat. No. 3,723,642 to Laakmann. In this implementation, a short array of detectors, such as 10–30 detectors, is scanned two-dimensionally across the image. The detectors are oriented parallel to the line scan dimension of the television raster to be generated. The signals from the detectors are summed appropriately in a delay line and processed to provide the image. Another recent prior art development consists of staring systems utilizing cooled or uncooled two-dimensional detector arrays which are electronically readout by a two-dimensional charge coupled device or a cross bar switch array. The detector focal planes of staring systems utilize solder bumps to connect each detector of the array to an appropriate readout node of an integrated circuit on a substrate. Cooled infrared detectors require solder bumps of high electrical and thermal conductance. On the other hand, uncooled temperature sensitive detectors need solder bumps with high electrical conductance but minimal thermal conductance.

The most recent prior art in staring system technology uses metal bumps which provide the needed high electrical and thermal conductance for cooled detectors but which cause excessive thermal conductance for uncooled detectors. Unfortunately, cooling in infrared detector systems requires expensive complex cryogenic coolers to maintain the detectors at proper operating temperatures. Such systems tend to be bulky, weighty and not readily susceptible to mass production techniques. Furthermore, they tend to have a lifetime which is limited by the life of the cooling system. However, the aforementioned thermal conductance problem stemming from the use of metal bumps in staring systems, results in a significant disadvantage to the use of uncooled, two-dimensional temperature sensitive detector arrays. More specifically, current arrays of the uncooled configuration operate about two orders of magnitude below the performance capabilities of ideal uncooled detectors because the excessive thermal conductance of metal bumps reduces the signal and increases the temperature fluctuation noise generated by the heat flow between the detectors and the environment.

The present invention decreases thermal conductance by reducing the cross-section and increasing the length of the support link between the detector and its environment. In addition, materials of minimal thermal conductivity are used for the detector support and detector leads having minimum heat conductance are employed. These thermal conductance reducing features are provided within the constraints of a two-dimensional detector array with negligible dead space in the focal plane, that is, space which does not respond to the infrared signal. The present invention thus reduces the performance diminishing thermal conductance significantly and yet does so in a two-dimensional detector array in which more than 90% of the array area converts the incident infrared radiation into electrical signals. It does so by combining a unique foacl plane with three principal features, a two-dimensional array of radiation concentrators, a detector support structure for two-dimensional array of widely separated uncooled detectors and an integrated circuit substrate for reading out the signals of the detector array.

The following issued U.S. patents are deemed to be pertinent to the present invention but without affecting its patentability.

U.S. Pat. No. 3,639,765 to Kleinerman is directed to an infrared image converter utilizing collecting optics such as a parabolic mirror to collect an infrared image and focus the image onto a screen.

U.S. Pat. No. 4,079,507 to King discloses silicon insulator polysilicon infrared imaging devices with edge detectors. The detectors have a trapezoid cross-section with perforations of the mask at one end.

U.S. Pat. No. 3,845,296 to Schnitzler is directed to a photosensitive junction controlled electron emitter and provides for a sandwich structure of photosensitive junctions in series with the mosaic of photo emitters.

U.S. Pat. Nos. 4,080,532; 4,162,402; and 4,379,232 to Hopper are directed to a ferro electric imaging system, and represent the current state of the art in two-dimensional solid state, uncooled thermal imaging.

U.S. Pat. No. 3,746,454 to Pace et al is directed to an infrared receiver for optical radar and discloses a plurality of microlenses, each of which utilizes a respective detector element but not for thermal isolation.

The patents to Chapman and Chapman et al, U.S. Pat. Nos. 4,029,962 and 3,989,946, respectively, discloses a pair of infrared image detection arrays which have certain pertinent geometric characteristics.

SUMMARY OF THE INVENTION

The present invention comprises a high resolution thermal imaging system utilizing a focal plane comprising a two-dimensional array of uncooled infrared detectors utilizing a novel detector support structure which reduces the cross-section and increases the length of the support link between each detector and the surrounding environment to the maximum extent to minimize thermal conduction. The invention also utilizes a unique two-dimensional array of radiation concentrators to maximize the efficiency of the array by making it possible to have more than 90% of the array area converting incident infrared radiation into the electrical signals. Still an additional feature of one embodiment of the present invention is an integrated circuit substrate which permits reading out the signals of the detector array.

The present invention utilizes a two-dimensional array of radiation concentrators to focus the infrared image either by means of direct imaging or reflected imaging onto a detector associated with a receiving area within the concentrator. The concentrators receive the radiation of the image with virtually no loss in contiguous receiving area and transmit the energy to widely spaced detectors thus providing lateral space needed for detector support of low thermal conductance structures. The detector support structure mechanically supports widely spaced detectors with minimal thermal conductance and electrically connects the detectors to an integrated circuit providing electronic readout of the detector array signals. The detector support structure utilizes the concept of suspending an array of widely spaced detectors in air or vacuum utilizing thin, narrow ribbons such as a thermally insulated ribbon which is folded to increase the length of the thermal conduction path. There is no thermal contact between the array of radiation collectors and the detector array thereby leaving a space between detectors required for the respective thermal insulation. In one embodiment the detector support structure is integrated with a readout IC substrate which utilizes a line multiplexer to transfer a plurality of parallel signals corresponding to a line of infrared detectors to an appropriately placed shift register, the contents of which are shifted out sequentially into a video port. The detectors of the present invention may be any of a number of well-known thermal sensitive devices including bolometric detectors, pyroelectric detectors, ferroelectric detectors and radiation thermocouples. All such types of detectors are compatible with the radiation concentrators, detector support structure and integrated circuit substrate of the present invention.

OBJECTS OF THE INVENTION

It is therefore a principal object of the present invention to provide an infrared imaging focal plane of high resolution and capable of operating without special cooling, and which provides means for avoiding high thermal conductance between each detector and an appropriate readout device whereby to significantly improve the performance capabilities of such infrared imaging planes as compared to the prior art.

It is an additional object of the present invention to provide an uncooled infrared focal plane of high resolution in which a two-dimensional detector array is provided with means for utilizing at least 90% of the array area to convert incident infrared radiation into electrical signals and wherein the performance of the array is significantly enhanced by reducing thermal conductance of each detector relative to attendant electrical and mechanical devices whereby to increase the signal-to-noise ratio and therefore the performance of the imaging plane.

It is still an additional object of the present invention to provide an infrared imaging focal plane capable of operating without special cooling, having a high resolution performance capability and which utilizes a two-dimensional detector array in which the cross-section and length of the support link between each detector and the surrounding environment has been designed to minimize thermal conductance therebetween.

It is still an additional object of the present invention to provide a novel, uncooled, infrared, high resolution focal plane comprising a two-dimensional array of radiation concentrators, a two-dimensional array of widely separated uncooled detectors supported on a novel detector support structure designed to reduce thermal conductance and therefore improve the performance of the detectors and an integrated circuit substrate for reading out the signals of the detector array.

BRIEF DESCRIPTION OF THE DRAWINGS

The aforementioned objects and advantages of the present invention as well as additional objects and advantages thereof will be more fully understood hereinafter as a result of a detailed description of preferred embodiments when taken in conjunction with the following drawings in which:

FIG. 5, comprising

DETAILED DESCRIPTION OF PREFERRED EMBODIMENTS

Figure 1:
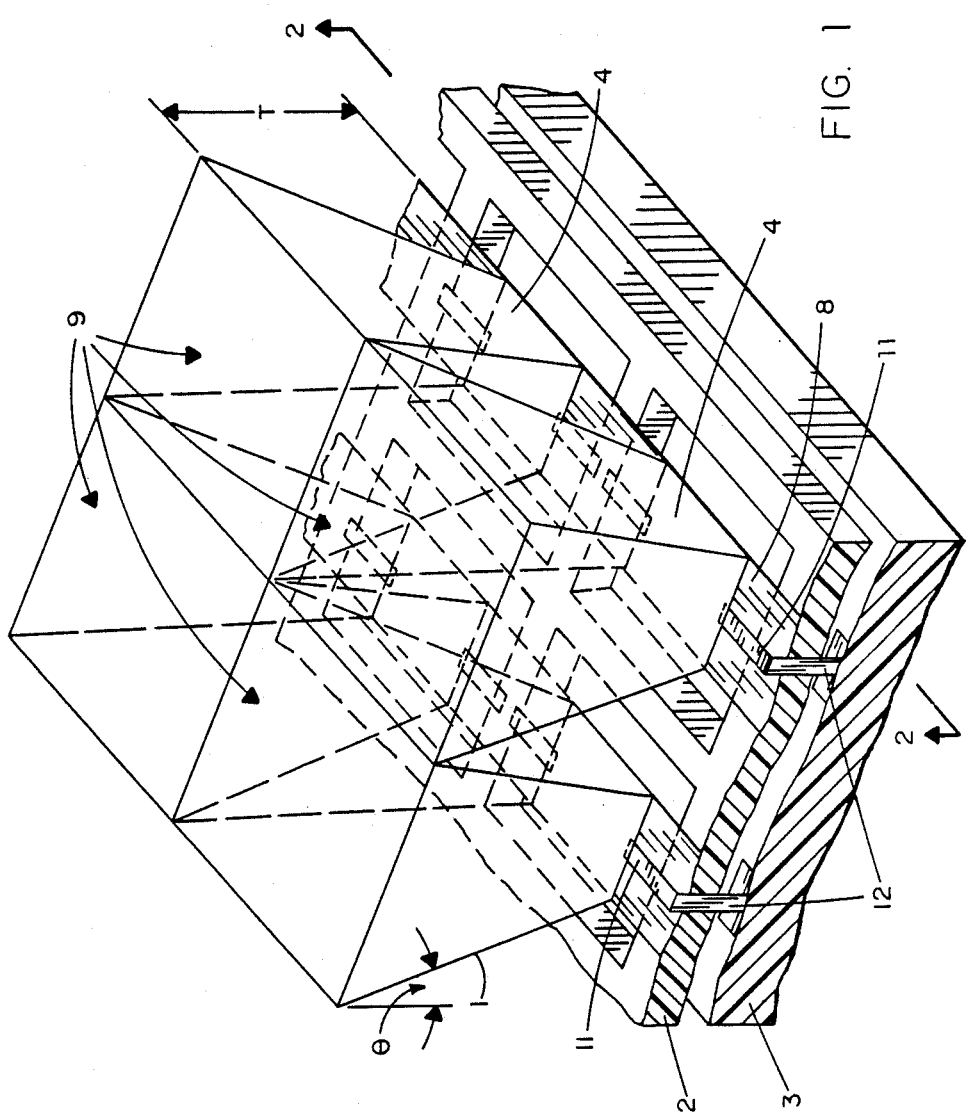
FIG. 1 is a conceptual three-dimensional drawing of the present invention illustrating a first embodiment thereof.

Referring first to FIG. 1 it will be seen that one embodiment of an infrared focal plane of the present invention comprises a two-dimensional array of radiation concentrators 1 positioned directly above but spaced from a plurality of detectors 4 the detectors being supported on a detector support structure 2 which in turn is arranged in parallel contiguous configuration relative to a readout integrated circuit 3. Radiation concentrators 1 are preferably light metal concentrators with a high infrared reflecting surface and high thermal conductivity to provide uniform temperature distribution. The concentrator can be readily fabricated by modern micro-machining techniques such as programmed laser machining or by a combination of photo-lithographic and electroplating techniques.

Figure 2:
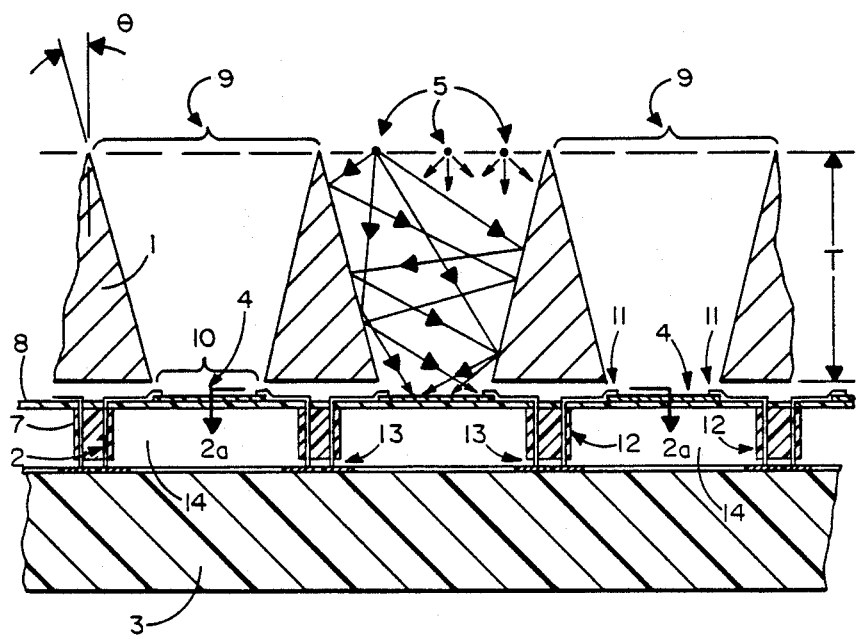
FIG. 2 is a cross-sectional plan view of the embodiment of FIG. 1 taken along lines 2—2 of FIG. 1.

The infrared images are incident focused on the receiving areas 9 of the concentrators 1. The rays at each image point within a given receiving area 9 are reflected to the corresponding detector 4 associated with that area. By way of example, FIG. 2 illustrates image point ray tracing within a given receiving area incident at a plurality of image points 5. The F number of the radiation concentrator optics determines the cone angle of the infrared ray emanating from each image point. The receiving area 9 of each concentrator represents a pixel, that is, the smallest pictorial element that may be resolved in the focal plane.

The purpose of the radiation concentrators 1 is to receive the radiation of an image with practically no loss in contiguous receiving areas 9 and to transmit this energy to widely spaced detectors 4. This provides lateral space needed for detector support with low thermal conductance as will be hereinafter more fully explained. The ratio of the receiving area 9 to an output area 10 adjacent to and facing each detector 4, should preferably be as large as possible to maximize the lateral detector spacing. This ratio is about equal to the optical gain because the irradiance of the area 9 is concentrated on the detector 4 within an area which is about equal to the output area 10 of each concentrator 1.

In order to prevent reflections from the inside of the concentrator back out through the receiving area 9 thereby losing energy that is otherwise incident on the concentrator, the wall angle theta and the height T of the concentrator must be kept below certain values. For example, an optical gain of 4 can be readily achieved with a wall angle theta of 2 degrees and a concentrator height of 14 mils. For these parameters maximum reflection loss of an infrared ray is about 3% for a wall reflectance of about 99% because the ray cannot be reflected more than three times before impining on the detector.

The detectors 4 are supported relative to the radiation concentrators 1 by an underlying detector support structure 2. The purpose of this structure is to mechanically support widely spaced detectors with minimum thermal conductance and to electrically connect these detectors to an underlying integrated circuit chip 3 which provides the electronic readout of the detector array. In the embodiment ilustrated in FIGS. 1 and 2, detector 4 are supported by relatively thin and narrow support ribbons 8 which bridge the interstices of the structure 2 with a low thermal conductivity material. As seen best in FIGS. 1 and 2a, electrical leads 11 deposited upon ribbons 8, connect detectors 4 to respective electrical feedthroughs 12.

Feedthroughs 12 provide electrically conductive pads through the structure 2 to input nodes of a readout integrated circuit 3 by means of connection to solder bumps 13 which lie on the surface of the integrated surface substrate underneath the structure 2. As seen best in FIG. 2, the nature of the geometry of the detector support structure 2 is that of an interleaved matrix of vertical support members 7 which provide a chamber 14 under each detector 4 which is in turn supported over the chamber the ribbon 8. Because of the positioning of chamber 14 beneath each detector to minimize the thermal conductance between the conductor and the underlying integrated circuit substrate, and further because of the low thermal conductivity material forming the ribbons 8 which support the detectors above the chamber 14 respectively, the overall thermal conductance problem of uncooled infrared detectors previously discussed in conjunction with the prior art is substantially ameliorated. The reduction in thermal conductance permits a reduction in the temperature fluctuation noise that might otherwise be generated by heat flow between the detectors and their adjacent environment.

Figure 3:
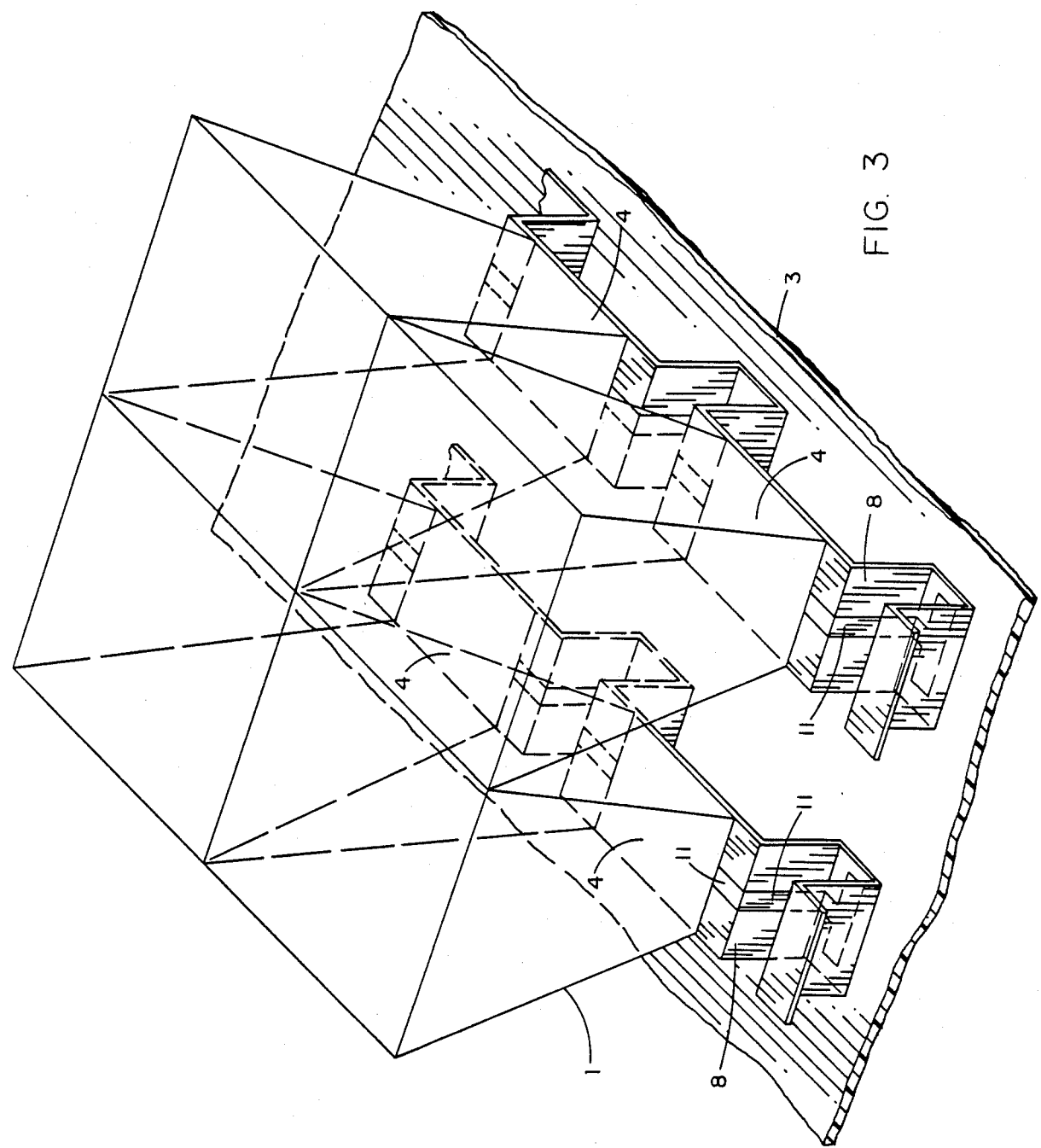
FIG. 3 is a conceptual three-dimensional view of a second embodiment of the present invention illustrating an alternative detector support structure therefor.
Figure 4:
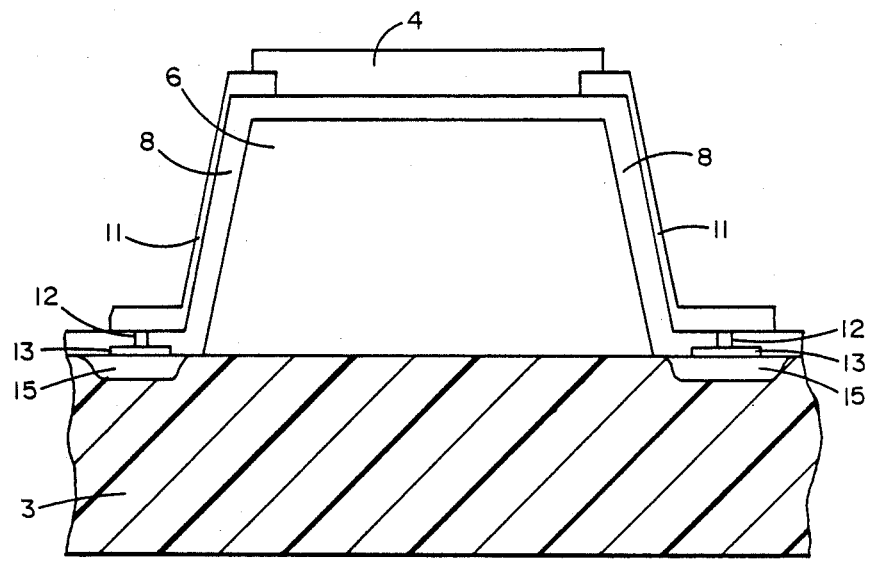
FIG. 4 is an enlarged cross-sectional view illustrating the detailed structure of a single detector configuration of the embodiment of FIG. 3.

The inventive feature of suspending an array of widely spaced detectors over an evacuated or air-filled chamber by means of thin, narrow ribbons can be implemented in a number of alternative configurations. By way of example, FIGS. 3 and 4 illustrate an embodiment of the invention where the support structure is integrated with the readout circuit substrate thus losing its separate identity. In addition, the thermally insulating ribbon 8 is folded, as seen best in FIG. 3, to increase the length of the thermal conduction path and thereby even further thermally isolate the detectors. The detailed structure of the second embodiment of the invention is best understood by reference to FIG. 4 wherein it is seen that the support ribbons 8 and overlying electrical lead 11 are folded to form respective sides of a trapezoid shaped cross-section completed by the detector 4 at the top and the readout integrated circuit substrate 3 at the bottom.

Figure 2A:
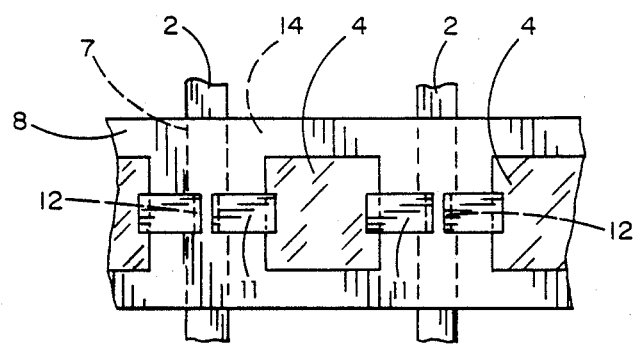
FIG. 2a is a top view of the detectors, detector support structure and electrical leads of the detector array portion of FIG. 1.

Because of this folded configuration there is no need for a separate support structure such as support structure 2 of the first embodiment of FIGS. 1, 2 and 2a. Instead, the feedthroughs or conducting interfaces 12 need pass only through the support ribbons 8 where they terminate in respective solder bumps 13 electrically connected to respective N-diffusions in a P-doped semi-conductor (or vice-versa) pads 15 forming a portion of the substrate 3. The vaulted configuration of the FIG. 4 embodiment provides a volume 6 underneath the folded support ribbon 8. This volume 6 may be air-filled to provide a selected degree of reduced thermal conductance to achieve a faster time response or preferably evacuated to provide an even lower level of thermal conductance resulting in a higher signal-to-noise ratio. It will be understood however that irrespective of the embodiment utilized for achieving the isolation of detectors 4 from the surrounding environment, each such embodiment utilizes a radiation collector array similar to that shown in FIG. 1. The collector array is not in thermal contact with the detector arrays. Such radiation collectors permit the detector arrays to be arranged so that there is a substantial space between detectors required for their thermal insulation.

Figure 5A:
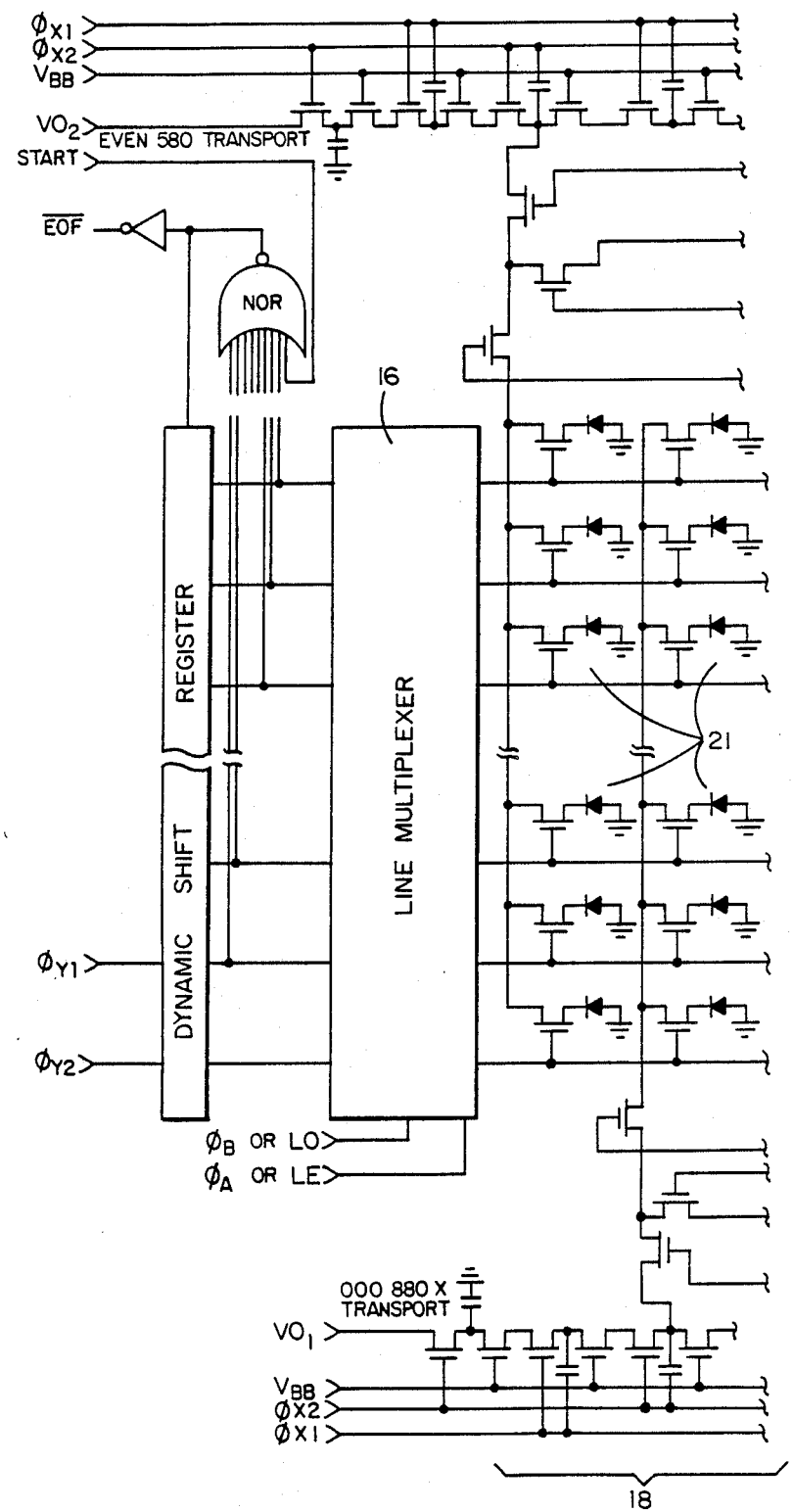
FIGS. 5a and 5b, is a schematic diagram of an integrated circuit chip layout that may be used for reading out electrical signals of a two-dimensional array of thermal detectors of the present invention.
Figure 5B:
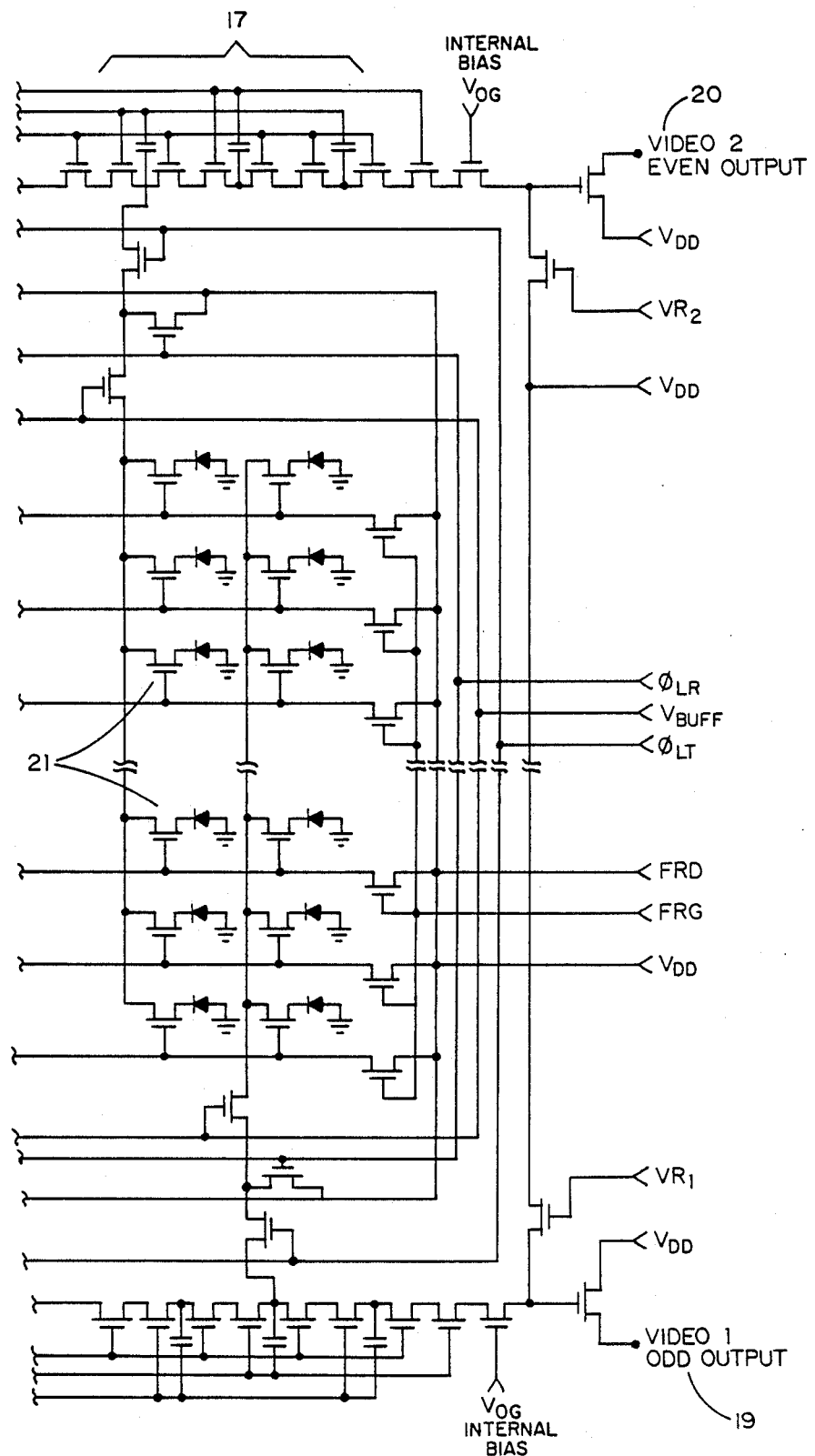

FIG. 5, comprising FIG. 5a and 5b, is a schematic diagram of an integrated circuit which is suitable for use as a readout medium for use in conjunction with the detector array and concentrator array of both of the two embodiments discussed above. The electronic circuit of FIG. 5 is substantially identical to a solid state imaging integrated circuit chip Part RA128X128A manufactured by the Reticon Corporation of Wellesley, Mass. Aside from minor modifications of external circuitry, the only difference between the circuit of FIG. 5 and that provided by the Reticon Corporation is that the visible light sensitive photo diodes of the Reticon device, which are adapted to convert visible light into electrical signals, have been replaced by bolometric detectors 21 which are adapted to function as thermal imaging detectors. In all other respects the circuit of FIG. 5 operates the same as the visible light imaging integrating circuit of the Reticon Corporation. More specifically, the diodes convert the infrared into electrical signals. A line multiplexer 16 activates one horizontal array of diodes at a time. The signals generated by these diodes are transferred in parallel to a pair of shift registers 17 and 18. Shift register 17 is used for transferring the signals on even numbered lines and shift register 18 is used for transferring the signals on odd numbered lines. The signals of an address line are loaded in parallel into the respective shift registers and subsequently shifted out to the right as seen in FIG. 5 to a pair of video ports 19 and 20. Video port 19 is connected to the output of shift register 18 for odd numbered signal lines and video port 20 is connected to shift register 17 for even numbered signal lines. The integrated circuit of FIG. 5 also contains circuitry for biasing the diodes and for controlling the readout process.

Bolometric detectors are not the only form of thermally sensitive detectors that can be used in the present invention. More specifically, ferroelectric detectors may also be employed with the integrated circuit chip of FIG. 5 and used in the structures of FIGS. 1 and 2 or 3 and 4. A ferroelectric detector is a temperature sensing device consisting of a thin wafer of ferroelectric crystal such as lithium tantalate or triglycine sulfate acting as the dielectric of a capacitor whose capacitance varies with temperature variations induced by radiation. This may be compared to a bolometric detector which relies on the absorption of radiation causing a rise in temperature of a resistance-like device which changes its resistance accordingly.

Figure 6:
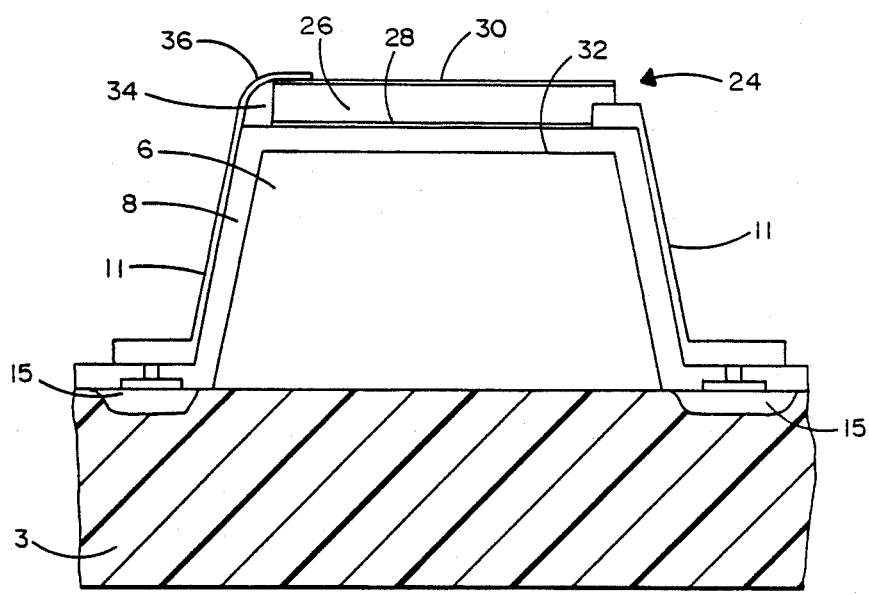
FIG. 6 is a detailed cross-sectional view similar to that of FIG. 4 but illustrating an alternative configuration utilizing a ferroelectric detector.

FIG. 6 illustrates the manner in which the integrated detector and IC configuration of FIG. 4 may be modified to accommodate a pyroelectric detector. More specifically, as shown in FIG. 6 each ferroelectric detector 24 comprises a ferroelectric material positioned between a bottom electrode 28 and a transparent top electrode 30. In addition, one of the two electrical leads 11 is modified as compared to the configuration of FIG. 4 whereby to provide interconnection to the top electrode 30. Insulating material 34 is provided between electrode 36 and bottom electrode 28 to preserve the integrity of the capacitive configuration of the pyroelectric detector 24. Thus the main geometric difference between the bolometric configuration of FIG. 4 and the ferroelectric configuration of FIG. 6 is that the former has opposing electrodes at the sides of the detecting area while the latter has electrodes covering the detector area.

Variations in the nature of the ferroelectric material 26 may also be made to provide different operating parameters for the detector 24. By way of example, by utilizing a ferroelectric material, detector 24 may be operated below the Curie temperature in the pyroelectric mode or above the Curie temperature in the ferroelectric mode.

Figure 7:
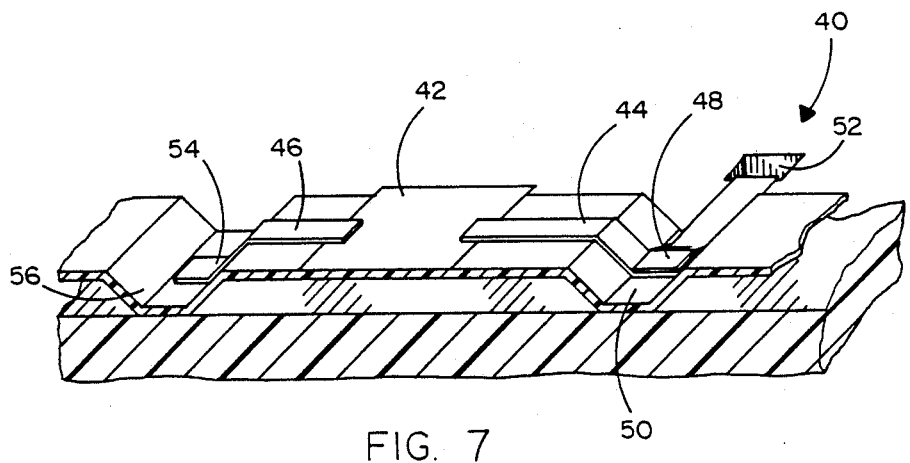
FIG. 7 illustrates still an additional embodiment of the invention utilizing a radiation thermocouple detector.

FIG. 7 illustrates still an additional alternative embodiment using a radiation thermocouple 40 as a detector. The hot junction of the thermocouple consists of a gold pad 42 connected on the one side to an N-type semiconductor 44 such as germanium silicide and on the other side to a P-type semiconductor 46 such as germanium silicide. The gold pad 42 is covered with an infrared absorber such as gold black or a multi-layered dielectric absorbing film to convert the infrared radiation into heat.

The cold reference junction 48 is formed in a groove 50 by the overlap of a P-type semiconductor that connects the junction 48 to the underlying readout substrate by means of node 52. The other readout 54 connects the thermocouple 40 through a hole in a polyimide ribbon insulator 56 to the underlying substrate.

It will now be understood that what has been disclosed herein comprises an uncooled, high resolution infrared focal plane in which the performance limit of ideal uncooled detectors can be more closely approached as compared to the prior art because of unique features which substantially reduce the thermal conductance between the detector and its surrounding environment. Reduced thermal conductance provides an increase in signal-to-noise ratio as compared to the prior art. In order to accomplish this reduction in thermal conductance the detectors of the present invention have been substantially isolated from their surrounding environment and from one another. The detectors have been separated from one another without producing any substantial dead space in the focal plane that would not otherwise respond to an infrared signal. This feature of the invention has been accomplished by the use of a two-dimensional array of radiation concentrators of selected material and geometric parameters to provide an optical gain which permits use of the total nominal receiving area of the image plane while permitting considerably spacing between the detectors.

The support structure for the detectors themselves is provided in a number of different configurations. In one such configuration a support structure provides interstitial chamber spaces over which the detectors are supported by thin narrow ribbons of low thermal conductive characteristics and which provides feedthroughs to an underlying readout integrated circuit substrate. In additional configuration the aforementioned ribbons are geometrically configured to provide an increased thermal length between the detectors by utilizing a folded ribbon geometry which is integrated onto the surface of the underlying readout integrated circuit substrate. In this configuration the detectors are held in a vaulted configuration which permits utilization of an underlying air-filled or evacuated chamber below each detector to further reduce the thermal conductivity associated with the environment adjacent each detector. A number of alternative detector configurations as well as a suitable electrical circuit of an underlying integrated circuit substrate for reading out the detector generated signals, have been disclosed.

Those having skill in the art to which the present invention petains will now, as a result of the applicants' teaching herein, perceive various modifications and additions which may be made to the present invention. By way of example, still further alternative embodiments of the detectors, detector support structures and associated radiation concentrators may now occur to those having the benefit of the applicants' teaching herein. However, all such modifications and additions are deemed to be within the scope of the present invention which is to be limited only by the claims appended hereto.

We claim:

1. A thermal imager comprising:
   a two-dimensional planar array of thermally sensitive detectors, each such detector being spaced from other detectors in said array to reduce the thermal conductance between detectors,
   a detector support structure having a plurality of low thermal conductance ribbons, each such ribbon being oriented to support at least one detector and associated electrical leads in a position that is spaced from all adjacent surfaces,
   means for processing electrical signals generated by said detectors on said electrical leads for producing a video image from said array, and
   a two-dimensional array of radiation concentrators positioned between said detector array and a source of thermal energy, said concentrators being positioned in spaced relation to said detector array for directing virtually all incident thermal energy onto said detectors while preventing substantially any thermal energy from being incident between said detectors, said concentrators having an optical gain of at least 2.

2. The thermal imager recited in claim 1 wherein said ribbon is folded to increase the length of the thermal conductance path between said detectors.

3. The thermal imager recited in claim 1 wherein said detector support structure further comprises a matrix of overlapping support members forming a plurality of chambers, each such chamber forming a thermally non-conductive region between a detector and said processing means.

4. The thermal imager recited in claim 1 wherein said detector comprises a bolometric sensor.

5. The thermal imager recited in claim 1 wherein said detector comprises a pyroelectric sensor.

6. The thermal imager recited in claim 1 wherein said processing means comprises an integrated circuit substrate having nodes connected to said electrical leads.

7. The thermal imager recited in claim 1 wherein said detectors are operated at ambient temperature.

8. The thermal imager recited in claim 1 wherein said concentrators are made of a material that is at least 90% reflective to infrared radiation.

9. The thermal imager recited in claim 1 wherein said concentrators transmit at least 90% of the incident thermal energy to said detectors.

10. An infrared high resolution thermal imaging plane comprising:
  a two-dimensional planar array of infrared sensitive detectors, each such detector being spaced from other detectors in said array to reduce the thermal conductance between detectors,
  a detector support structure having a plurality of low thermal conductance ribbons, each such ribbon being oriented to support at least one detector and associated electrical leads in a position that is spaced from all adjacent surfaces, means for processing electrical signals generated by said detectors on said electrical leads for producing a video image from said array, and
  a two-dimensional array of radiation concentrators positioned between said detector array and a source of infrared energy, said concentrators being positioned in spaced relation to said detector array for directing virtually all incident infrared energy onto said detectors while preventing substantially any infrared energy from being incident between said detectors, said concentrators having an optical gain of at least 2.

11. The infrared imager recited in claim 10 wherein said ribbon is folded to increase the length of the thermal conductance path between said detectors.

12. The infrared imager recited in claim 10 wherein said detector support structure further comprises a matrix of overlapping support members forming a plurality of chambers, each such chamber forming a thermally non-conductive region between a detector and said processing means.

13. The infrared imager recited in claim 10 wherein said detector comprises a bolometric sensor.

14. The infrared imager recited in claim 10 wherein said detector comprises a pyroelectric sensor.

15. The infrared imager recited in claim 10 wherein said processing means comprises an integrated circuit substrate having nodes connected to said electrical leads.

16. The infrared imager recited in claim 10 wherein said detectors are operated at ambient temperature.

17. The infrared imager recited in claim 10 wherein said concentrators are made of a material that is at least 90% reflective to infrared radiation.

18. The infrared imager recited in claim 10 wherein said concentrators transmit at least 90% of the incident infrared energy to said detectors.

19. The infrared imager recited in claim 10 wherein said detector comprises a radiation thermocouple.

* * * * *